Oct. 6, 1964 A. SOMLYODY 3,152,268

ELECTRONIC SEMICONDUCTOR COUNTING CIRCUIT USING DIODE MATRIX CONTROL MEANS

Filed June 18, 1962 2 Sheets-Sheet 1

INVENTOR
ARPAD SOMLYODY

BY Robert A. Green

ATTORNEY

INVENTOR.
ARPAD SOMLYODY
BY Robert A. Green
ATTORNEY 3,152,268

ELECTRONIC SEMICONDUCTOR COUNTING CIRCUIT USING DIODE MATRIX CONTROL MEANS

Arpad Somlyody, Raritan, N.J., assignor to Burroughs Corporation, Detroit, Mich., a corporation of Michigan Filed June 18, 1962, Ser. No. 203,194
6 Claims. (Cl. 307—88.5)

This invention relates to electronic counting circuits and particularly to semiconductor counting circuits utilizing diode matrix circuits.

One type of electronic semiconductor counter recently devised utilizes a diode matrix to transmit counting signals to a plurality of transistors, one transistor being provided for each counting step to provide decimal output logic. The transistors are also interrelated through the diode matrix to provide the desired counting sequence. The diode matrix portion of the circuit may conveniently comprise semiconductor diodes, all prepared on a single semiconductor crystal. Theoretically, a counter of the type under consideration can comprise any number of counting steps; however, as the number of counting steps increases, the diode matrix utilizes more and more diodes and the construction of such a matrix on a single body of semiconductor material becomes undesirably complex.

Accordingly, the objects of the present invention concern the provision of a semiconductor counter having a large number of counting steps and utilizing a diode matrix of relatively simple construction.

Briefly, a counting circuit embodying the invention includes a relatively large number of count registering devices, each of which comprises a separate step in a counting chain. The register devices are interrelated through a diode matrix to achieve the desired counting or registering operation. According to the invention, the diode matrix is prepared in sections, each of which is related to a group of counting devices. Each diode matrix section includes auxiliary circuit means for holding inactive an adjacent diode matrix section and associated register devices while its own matrix and register devices perform a counting operation.

The invention is described in greater detail by reference to the drawing wherein.

Figure 1:
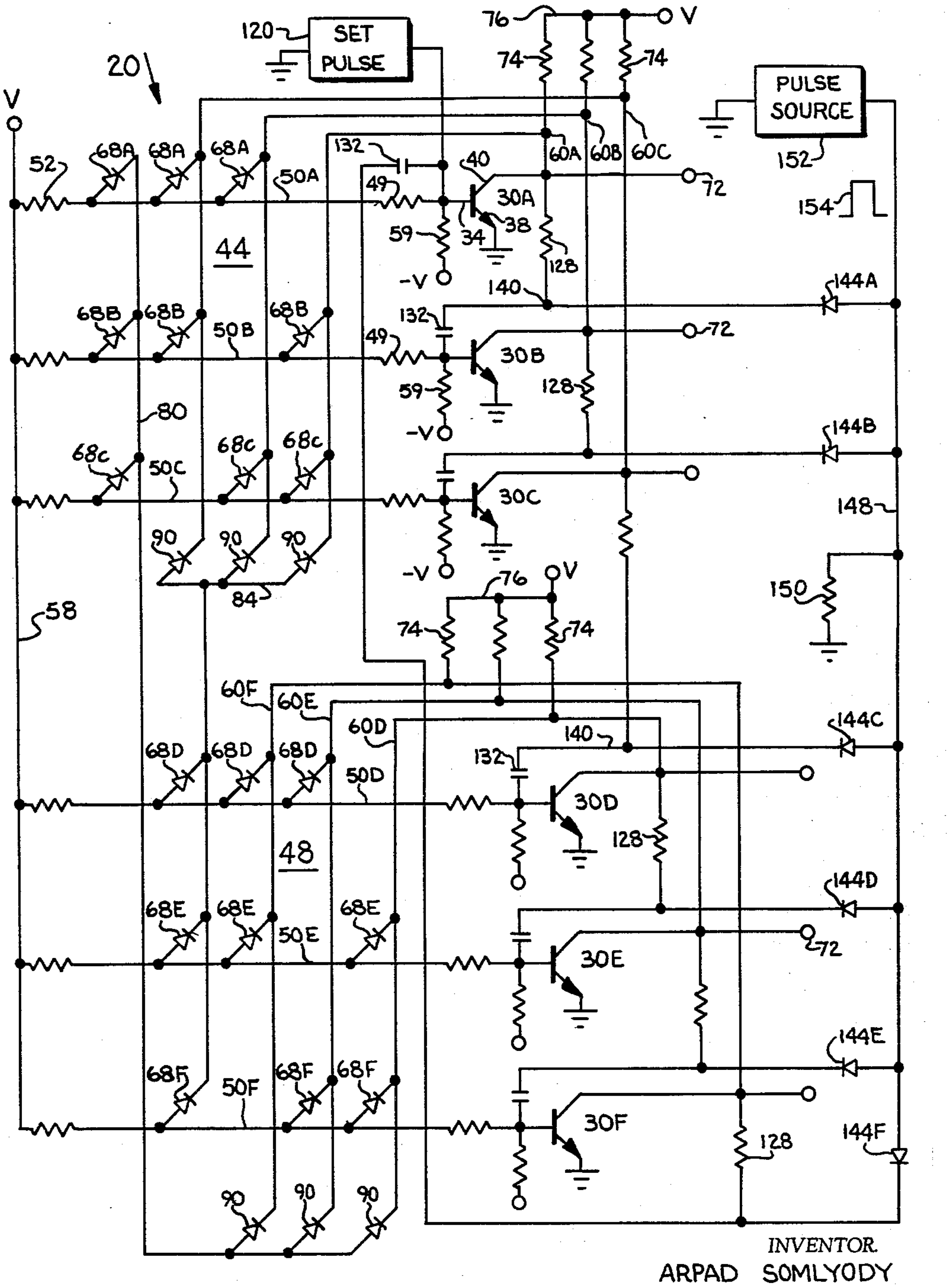
FIG. 1 is a schematic representation of a circuit embodying the invention.

Referring to the drawing, a counter circuit 20 embodying the invention includes a plurality of count registering means which comprise electron discharge devices, for example, semiconductor devices 30 such as transistors or the like. Each transistor operates in the nature of a switch and is adapted to execute or register one count, and the total number of transistors provided in the chain of counters is determined by the total number of counts to be executed by the counting circuit. For convenience, only six counting steps are shown including transistors 30A, 30B, 30C, 30D, 30E, and 30F. The discharge devices 30 are shown as three-element NPN transistors; however, it is clear that PNP transistors or other devices may be used to perform the same function. Each transistor 30 shown in the drawings includes base, emitter, and collector electrodes 34, 38, and 40, respectively.

According to the invention, a matrix of diodes is provided for coupling input signals to the register devices 30 and to interrelate the register devices so that the counting operation proceeds in the desired direction through the counting cycle. It can be seen that a counter having a large number of register devices requires a matrix having a large number of diodes and, under some circumstances, it might be undesirably difficult or expensive to prepare a single matrix including a large number of diodes. Thus, according to the invention, the register devices or counter steps are arranged in groups, and each group is provided with its own diode matrix section which is a smaller, simpler part of the whole. The circuitry required with such an arrangement is described below.

Referring to the drawing, the six transistors are shown arranged in two groups, one including transistors 30A, 30B, and 30C, and the other including transistors 30D, 30E, and 30F. The first group is coupled to a first diode matrix 44, and the second group is coupled to a second diode matrix 48, with the diode matrices being interrelated in a manner to be described.

In the circuit of FIG. 1, the emitter electrode 38 of each transistor 30 is connected to a source of reference potential such as ground, and the base electrode is connected through a base register 49, lead 50, and resistor 52 to a bus 53 which is coupled to a positive D.C. power supply V. The lead 50, which is connected to a particular base electrode, carries the same letter designation as its transistor. Thus, transistor 30A is coupled to lead 50A, transistor 30B to lead 50B, etc. Each base electrode is also coupled through a resistor 59 to a small negative D.C. power source —V. Each collector electrode 40 is also provided with an output lead 60 which is connected to the associated diode matrix, with the leads 60A, 60B, and 60C from the collector electrodes of transistors 30A, 30B, and 30C, respectively, being coupled to diode matrix 44, and the leads 60D, 60E, and 60F from the collector electrodes of transistors 30D, 30E, and 30F, respectively, being coupled to diode matrix 48. Specifically, lead 60 from transistor 30A is connected through diode 68B oriented as shown to lead 50B and the base electrode of transistor 30B and through diode 68C to lead 50C and base electrode of transistor 30C. Similarly, the collector of transistor 30B is coupled through its lead 60B through diode 68A and lead 50A to the base electrode of transistor 30A and through diode 68C and lead 50C to the base electrode of transistor 30C. The collector of transistor 30C is similarly connected through diodes 68A and 68B to the base electrodes of transistor 30A and 30B, respectively.

In the same way, the collector electrode of transistor 30D is coupled to the base electrodes of transistors 30E and 30F; the collector of transistor 30E is coupled to the base electrodes of transistors 30D and 30F, and the collector of transistor 30F is coupled to the base electrodes of transistors 30D and 30E.

Each collector electrode is provided with an output terminal 72, by means of which it may be connected to a suitable utilization circuit, for example, a cold cathode indicator glow tube. Each collector lead 60A to 60F is also coupled through a resistor 74 and bus 76 to a positive D.C. power supply V.

Diode matrix 44 includes a bus 80 which is connected through diodes 68A, 68B, and 68C to base leads 50A, 50B, and 50C, respectively. Diode matrix 44 also includes a bus 84 to which leads 60A, 60B, and 60C are connected through diodes 90. Bus 84 is also coupled through diodes 68D, 68E, 68F to base leads 50D, 50E, and 50F; and leads 60D, 60E, and 60F are coupled through diodes 90 to bus 80.

A source 120 of positive pulses for setting or resetting the transistors 30 to initiate a counting cycle is coupled to the base electrode of transistor 30A.

The counting pulses to be registered in the circuit 20 may be applied thereto in several different ways. For example, a flip-flop driver may be coupled to the circuit, or the arrangement shown in the drawing may be employed. In this arrangement, each collector electrode is coupled through a resistor 128 and a capacitor 132 to the base electrode of the next adjacent transistor in the counting chain. Thus, the collector of transistor 30A is coupled to the base of 30B, the collector of 30B is coupled to the base of 30C, etc. In addition, the junction 140 between each resistor and capacitor is coupled through a diode 144, oriented as shown, to a lead 148 which is connected through a resistor 150 to ground and to a source 152 of positive counting pulses 154.

In operation of the circuit 20, the counting operation is begun by turning on transistor 30A by means of a positive pulse applied to its base electrode from the source 120. When transistor 30A is turned on, its collector electrode is reduced to about ground potential, and this potential coupled through diodes 68B and 68C holds the base electrodes of transistors 30B and 30C at about ground potential, whereby these transistors are held off. The ground potential of the collector electrode of transistor 30A is also coupled through diode 90, bus 84, and diodes 68D, 68E, and 68F to transistors 30D, 30E, and 30F, which are also held off.

Since each of the diodes 144 has its cathode coupled to a collector electrode which is relatively positive and its anode coupled to about ground potential, these diodes are reverse-biased and cannot transmit a signal pulse 154 to the base electrodes of any of the transistors. However, diode 144A, which is coupled to the collector electrode of transistor 30A, has its cathode at about ground potential so that, although the diode is reverse-biased, the magnitude of this reverse-bias is sufficiently small so that the next counting pulse 154 applied to the bus can be transmitted to the base electrode of transistor 30B which is turned on thereby.

The collector electrode of transistor 30B is now at about ground potential, and this potential, coupled through lead 60B and diodes 68A and 68C, holds off transistors 30A and 30C. This potential, also coupled through diode 90 and bus 84, holds off transistors 60D, 60E, and 60F, as described above with respect to transistor 30A. In the same way, each counting pulse causes a count to be registered by each of the transistors in order. When the count reaches transistor 30D, which is coupled to diode matrix 48, transistor 30D holds off the transistors in its own group in the manner described above, and it also holds off the transistors 30A, 30B, and 30C through bus 84 and bus 80 and the diodes associated therewith.

Those skilled in the art will appreciate that certain modifications may be made in practicing the invention. For example, the number of transistors in each group may be varied as desired, and the number of groups of transistors may be increased as desired.

Figure 2:
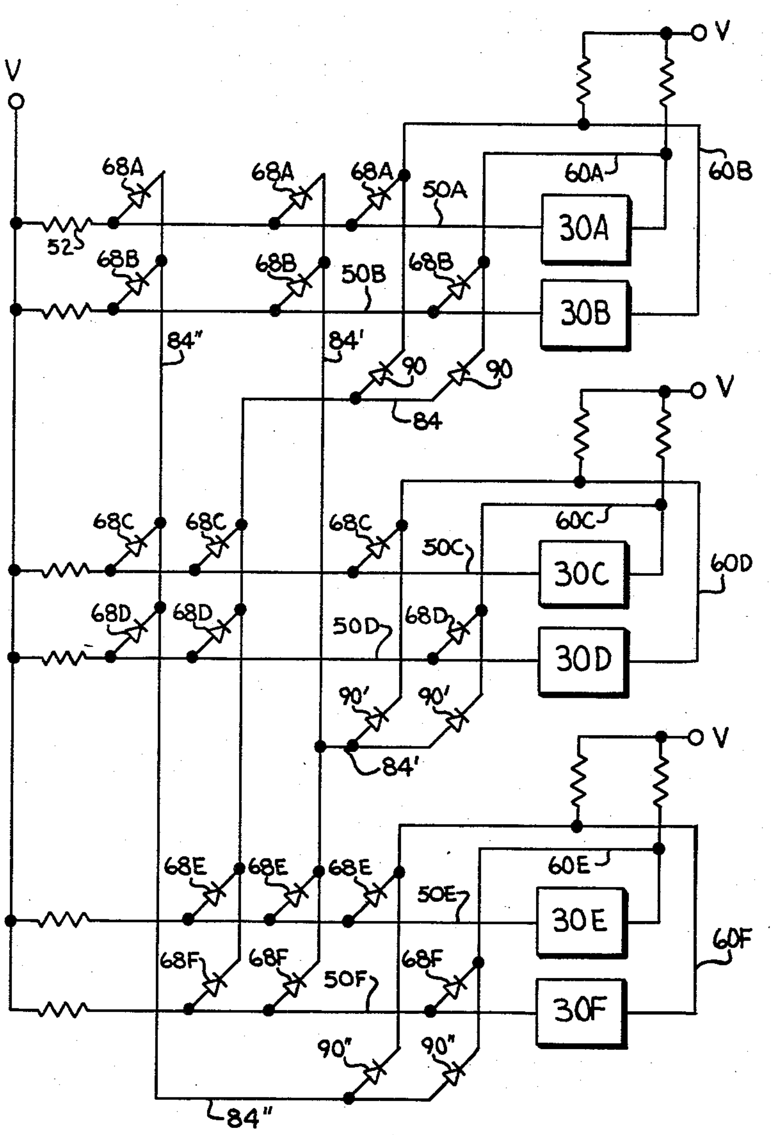
FIG. 2 is a schematic representation of a modification of the circuit of FIG. 1.

A modification of the invention comprising a counting circuit utilizing three groups of counting stages is shown in FIG. 2. In general, the circuit of FIG. 2 is the same as that of FIG. 1 and some elements, such as the source of counting pulses, are omitted. In addition, for purposes of simplification, each group of counting stages includes two counting steps, each represented by a block which is intended to include a transistor and some of its associated resistors and voltage sources. The counter circuit of FIG. 2 comprises a first group of counters including counters 30A and 30B, a second group of counters including 30C and 30D, and a third group of counters including 30E and 30F. The input or base electrodes of the transistors are coupled, as in FIG. 1, through leads 50A, 50B, etc., and resistors 52 to a power source V. In addition, in each group, the output electrode of each counter is coupled through a diode 68 to the input of each of the other counters.

As in FIG. 1, output leads 60A and 60B are connected through diodes 90 to bus 84. In this circuit, in addition, bus 84 is coupled through diodes 68 to the input electrodes of counters 50C, 50D, 50E, and 50F. Similarly, output leads 60C and 60D are coupled through diodes 90′ to a bus 84′ which in turn is coupled through diodes 68 to the inputs of counters 50A, 50B, 50E, and 50F. Output leads 60E and 60F are similarly connected through diodes 90″ to bus 84″ which is connected in turn through diodes 68 to the inputs of counters 50A, 50B, 50C, and 50D.

In operation of the circuit of FIG. 2, the general counting function is performed in the manner described above with respect to FIG. 1. In addition, when transistors 30A or 30B are in the process of registering a count, they operate through diodes 90 and bus 84 to hold off all of the counters of the other two groups. Similiarly, when counters 30C or 30D are in the process of registering a count, they operate through diodes 90′ and bus 84′ to hold off the counters in the other two groups. And when transistors 30E and 30F are in the process of registering a count, they operate through diodes 90″ and bus 84″ to hold off all of the transistors of the other two groups. Thus, it can be seen that a circuit embodying the invention may include substantially any number of groups of transistors and any number of transistors in a group.

What is claimed is:

1. A counting circuit including a plurality of count registering devices coupled together to perform a counting operation,
   said register devices being arranged in groups, each including a plurality of said devices,
   electronic circuit means associated with each group of register devices including connections for applying input signals to said devices and coupling the devices to each other in a pattern of connections which regulates the count registering operation,
   each register device including an input and output electrode and said electronic circuit means, which provides said pattern of connections between said register devices, comprising a diode matrix including a plurality of diodes with the output electrode of each register device in each group being coupled through a diode to the input electrode of every other device in its group,
   means coupled to each diode matrix for applying input signals thereto, and
   auxiliary circuit means coupling each group of register devices to every other group for controlling the count registering operation of each group of register devices.

2. A counting circuit including a plurality of count registering devices coupled together to perform a counting operation,
   said register devices being arranged in groups, each including a plurality of said devices,
   electronic circuit means associated with each group of register devices including connections for applying input signals to said devices and coupling the devices to each other in a pattern of connections which regulates the count registering operation,
   each register device including an input and output electrode and said electronic circuit means, which provides said pattern of connections between said register devices, comprising a diode matrix including a plurality of diodes with the output electrode of each register device in each group being coupled through a diode to the input electrode of every other device in its group,
   means coupled to each diode matrix for applying input signals thereto, and
   auxiliary circuit means coupling each group of register devices to every other group for controlling the count registering operation of each group of register devices and for holding inactive a group of register devices while another group executes a counting operation.

3. A counting circuit including a plurality of count registering devices coupled together to perform a counting operation,
   said register devices being arranged in groups, each including a plurality of said devices,
   electronic circuit means associated with each group of register devices including connections for applying input signals to said devices and coupling the devices to each other in a pattern of connections which regulates the count registering operation, each register device including an input and output electrode and said electronic circuit means, which provides said pattern of connections between said register devices, comprising a diode matrix including a plurality of diodes with the output electrode of each register device in each group being coupled through a diode to the input electrode of every other device in its group, means coupled to each diode matrix for applying input signals thereto, and an auxiliary group of diodes associated with each diode matrix for holding inactive an adjacent diode matrix and group of register devices while its own register devices execute a counting operation.

4. A counting circuit including a plurality of count registering devices coupled together to perform a counting operation, said register devices being arranged in groups, each including a plurality of said devices, electronic circuit means associated with each group of register devices including connections for applying input signals to said devices and coupling the devices to each other in a pattern of connections which regulates the count registering operation, each register device including an input and output electrode and said electronic circuit means, which provides said pattern of connections between said register devices, comprising a diode matrix including a plurality of diodes with the output electrode of each register device in each group being coupled through a diode to the input electrode of every other device in its group, means coupled to each diode matrix for applying input signals thereto, and an auxiliary group of diodes associated with each diode matrix for holding inactive an adjacent diode matrix and group of register devices while its own register devices execute a counting operation, said auxiliary group of diodes including one diode for each register device in the group of devices held inactive.

5. A counting circuit including first and second groups of counting devices connected in series to execute a counting cycle with the count proceeding from one device to the next in one group and then from one device to the next in the second group, each counting device including input and output means, an input count pulse source coupled to the input means of each counting device, the output means of each counting device being coupled to the input means of every other counting device in its group whereby as each device executes a count, it prevents all other devices in its group from executing a count, each counting device also having its output means coupled through a conductive path to the input means of the next adjacent device to control the progression of the counting operation from one device to the next, and auxiliary circuit means associated with each group of counting devices for preventing the counting devices of one group from performing a counting operation when the counting devices of the other group are performing the counting operation.

6. The circuit defined in claim 5 wherein said auxiliary circuit means includes (1) a first plurality of diodes which couple the output of each counting device in said first group to the input of every other counting device in said second group and (2) a second plurality of diodes which couple the output of each counting device in said second group to the input of each counting device in said first group, whereby when a device in one of said groups is registering a count, no device in the other group can register a count.

References Cited in the file of this patent

UNITED STATES PATENTS

| | | |
|---|---|---|
| 3,087,075 | Faulkner | Apr. 23, 1963 |
| 3,089,091 | Lindenthal | May 7, 1963 |